(12) United States Patent
Kaneko et al.

(10) Patent No.: US 8,013,524 B2
(45) Date of Patent: Sep. 6, 2011

(54) ORGANIC EL DISPLAY (75) Inventors: Katsuhiro Kaneko, Shiga (JP); Shinichi Abe, Shiga (JP)

(73) Assignee: Kyocera Corporation, Kyoto (JP)

( * ) Notice: Subject to any disclaimer, the term of this patent is extended or adjusted under 35 U.S.C. 154(b) by 86 days.

(21) Appl. No.: 12/634,131

(22) Filed: Dec. 9, 2009

(65) Prior Publication Data

US 2010/0141128 A1 Jun. 10, 2010

Related U.S. Application Data (63) Continuation of application No. 11/548,120, filed on Oct. 10, 2006, now Pat. No. 7,652,421.

(30) Foreign Application Priority Data

Oct. 28, 2005 (JP) .................................. 2005-314820

(51) Int. Cl.
*H01L 51/52* (2006.01)
(52) U.S. Cl. ........................................ 313/505; 313/504

(58) Field of Classification Search .................. 257/40, 257/72, 98–100, 642–643, 759; 313/498–512; 315/169.1, 169.3; 427/58, 64, 66, 532–535, 427/539; 428/690–691, 917; 438/26–29, 438/34, 82, 455; 445/24–25
See application file for complete search history.

(56) References Cited

U.S. PATENT DOCUMENTS

6,998,775 B2  2/2006 Sugiura et al.

*Primary Examiner* — Peter J Macchiarolo
*Assistant Examiner* — Donald L Raleigh (57) ABSTRACT An organic EL display of the present invention includes a plurality of organic EL devices, each including a first electrode, an intermediate insulating film disposed on the first electrode so as to have an exposed portion in which the first electrode is partially exposed, an organic layer disposed on the exposed portion, and a second electrode disposed on the organic layer. The organic layer has, on a part disposed on the exposed portion, a thick film portion disposed around the center of the exposed portion and a thin film portion disposed around the end of the exposed portion and having a smaller thickness than the thick film portion, and the thin film portions of the adjacent organic EL devices are substantially equal in width.

6 Claims, 11 Drawing Sheets

ORGANIC EL DISPLAY

CROSS REFERENCE TO RELATED APPLICATION(S)

This application is a continuation of U.S. patent application Ser. No. 11/548,120, filed Oct. 10, 2006, which is incorporated by reference as if fully set forth.

FIELD OF THE INVENTION

The present invention relates to an organic EL display (Organic Electroluminescent Display).

BACKGROUND

At present, organic EL displays, plasma displays, liquid crystal displays and so on are mainly known as thin flat displays. Of these displays, organic EL displays use self-luminous devices and have various advantages including low dependence on vision, low power consumption, low cost, and a simple manufacturing process, and thus organic EL displays are expected to become dominant as next-generation displays.

However, striped unevenness recognizable by persons may clearly appear on the display screens of the organic EL displays.

SUMMARY

The present invention is made in view of this problem. An object of the present invention is to provide a technique for improving picture quality by reducing the occurrence of striped unevenness on a display.

An organic EL display of the present invention comprises a plurality of organic EL devices. Each of the organic EL devices includes a first electrode, an intermediate insulating film disposed on the first electrode so as to form an exposed portion in which the first electrode is partially exposed, an organic layer disposed at least on the exposed portion, and a second electrode disposed on the organic layer. The organic layer has, on a part disposed on the exposed portion, a thick film portion and a thin film portion. The thick film portion is disposed around the center of the exposed portion, and the thin film portion is disposed around the end of the exposed portion and has a smaller thickness than the thick film portion. The thin film portions of the adjacent organic EL devices are substantially equal in width.

DETAILED DESCRIPTION OF THE PREFERRED EMBODIMENTS

An embodiment of the present invention will be discussed below in accordance with the accompanying drawings.

<Schematic Configuration of an Organic EL Display>

Figure 1:
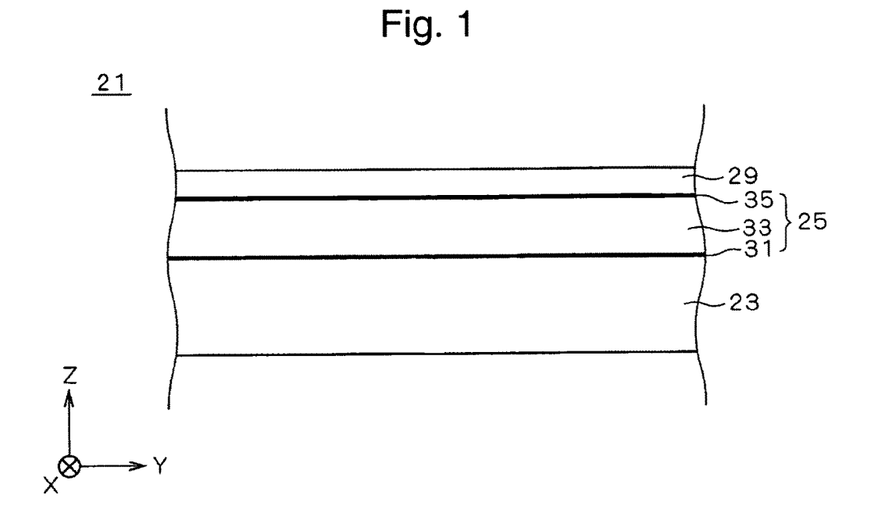
FIG. 1 is a schematic sectional view illustrating the schematic configuration of an organic EL display.

FIG. 1 is a schematic sectional view illustrating schematic configuration of an organic EL display 21 according to the embodiment of the present invention. In FIG. 1 and other figures, three axes of X, Y and Z orthogonal to one another or two axes of X and Y orthogonal to each other are illustrated when necessary in order to clarify the directional relationship.

The organic EL display 21 is, for example, a top emission type display. As shown in FIG. 1, the organic EL display 21 includes a substrate 23 made of a glass substrate or the like as a transparent substrate, an element part 25 formed on the substrate 23, and a sealing film 29 formed so as to cover the entire element part 25. The element part 25 includes a first electrode 31, an organic layer 33, and a second electrode 35 in this order from the substrate 23. The organic layer 33 is interposed between the first and second electrodes 31 and 35.

Figure 2:
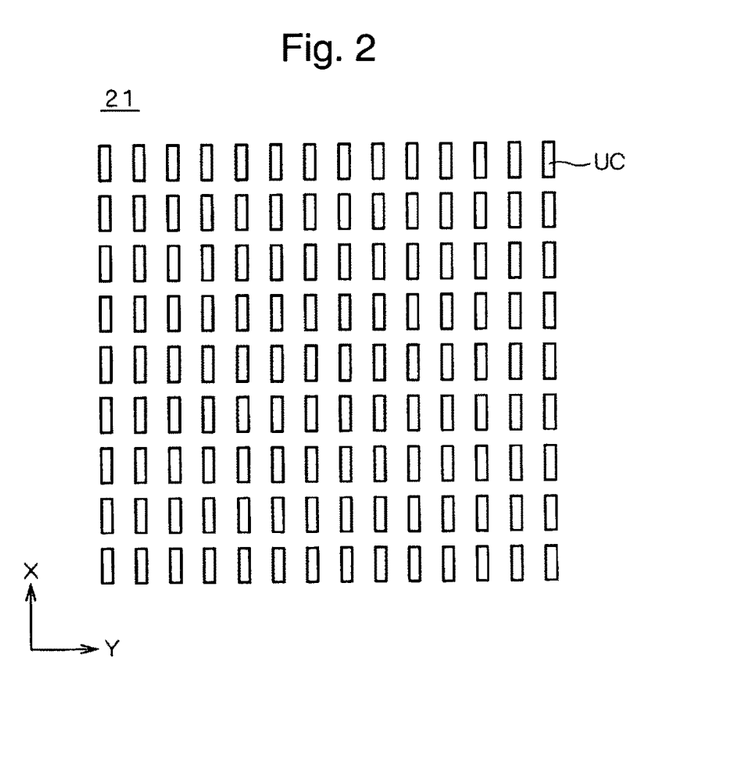
FIG. 2 is a schematic plan view illustrating the pixel layout of the organic EL display.

FIG. 2 is a schematic plan view illustrating the pixel layout of the organic EL display 21.

In the organic EL display 21, a number of pixels UC having substantially rectangular shapes are arranged in rows and columns. As shown in FIG. 2, the long sides of the pixels UC lie along the X-axis direction and a number of the pixels UC are spaced at predetermined distances or intervals along the X direction and the Y direction. In the present embodiment, the pixel UC is a rectangle having long sides and short sides.

Figure 3:
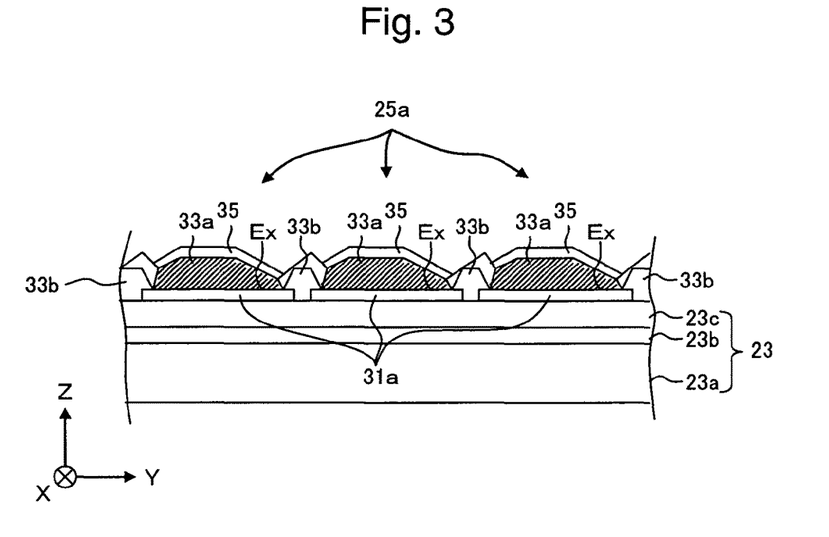
FIG. 3 is a schematic sectional view illustrating the configuration of organic EL devices.

FIG. 3 is a schematic sectional view illustrating the configuration of organic EL devices 25a each forming a pixel UC. FIG. 3 shows three organic EL devices 25a which form three adjacent pixels. In order to clarify the shape of the organic layer, the second electrode 35 and the sealing film 29 sequentially formed on the organic layer are omitted in FIG. 3.

As shown in FIG. 3, a TFT layer 23b and a flattening film 23c are sequentially formed on a substrate 23a, and the organic EL devices 25a are formed thereon.

The organic EL device 25a includes a lower electrode 31a corresponding to the first electrode 31, an intermediate insulating film 33b, an organic layer 33a (hatched portion), and the second electrode 35.

The lower electrode 31a is a layer having a rectangular surface on the XY plane. The lower electrodes 31a are spaced at certain distances on the flattening film 23c according to the pixel layout of FIG. 2.

The intermediate insulating film 33b is formed so as to surround the lower electrode 31a. The outer edge portion of the top surface of the lower electrode 31a is covered with the intermediate insulating film 33b. The other portion of the lower electrode 31a is not covered with the intermediate insulating film 33b and is exposed to the organic layer 33a.

The organic layer 33a is disposed on a portion Ex not covered with the intermediate insulating film 33b (hereinafter, will be also referred to as an "exposed portion") on the top surface of the lower electrode 31a. The area of the exposed portion Ex, when being viewed from the front of the screen (in the Z direction), corresponds to the pixel UC.

The second electrode 35 is disposed on the organic layer 33a.

Figure 4:
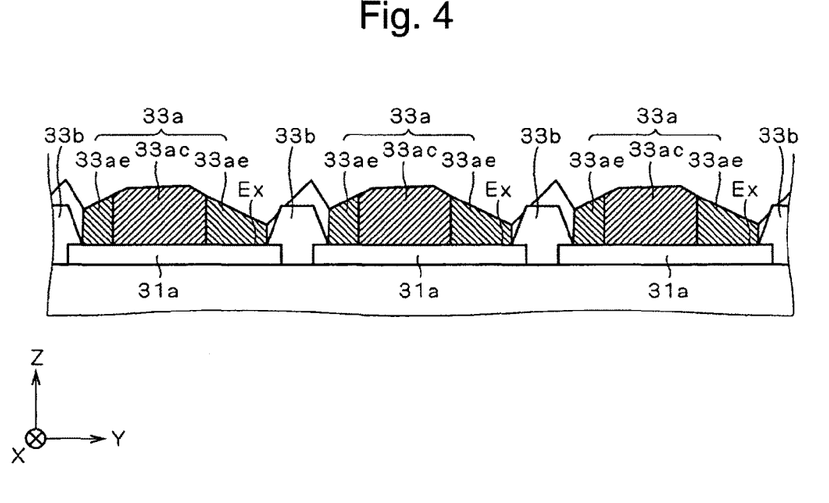
FIG. 4 is a sectional view focusing on the organic EL devices.

FIG. 4 focuses on the organic EL devices 25a of FIG. 3.

As shown in FIG. 4, each organic layer 33a has a flat top surface at the center portion and a thickness of the organic layer 33a decreases toward the outer edge portion due to a method of forming the organic layer (will be described later). To be specific, each organic layer 33a includes a portion (hereinafter, will be referred to as a "thick film portion") 33ac and a portion (hereinafter, will be referred to as a "thin film portion") 33ae. The thick film portion is disposed around the center of the exposed portion Ex, has a relatively large thickness (in the Z direction), and has a substantially flat top surface. The thin film portion is disposed around the edge of the exposed portion Ex, has a relatively small thickness, and has a top surface tilted toward the outer edge portion of the organic layer 33a, immediately above the exposed portion Ex (that is, the area of the exposed portion Ex when being viewed in the Z direction).

In this figure, in the organic layer 33a disposed just above the exposed portion Ex, when setting a boundary at a point having a 95% thickness relative to the average thickness of the area of a predetermined range located around the center of the exposed portion Ex, a portion having a thickness larger than 95% is referred to as 33ac and a portion having a thickness smaller than 95% is referred to as 33ae.

<The Method of Forming the Organic Layer and the Occurrence of the Thin Film Portion>

Figure 5:
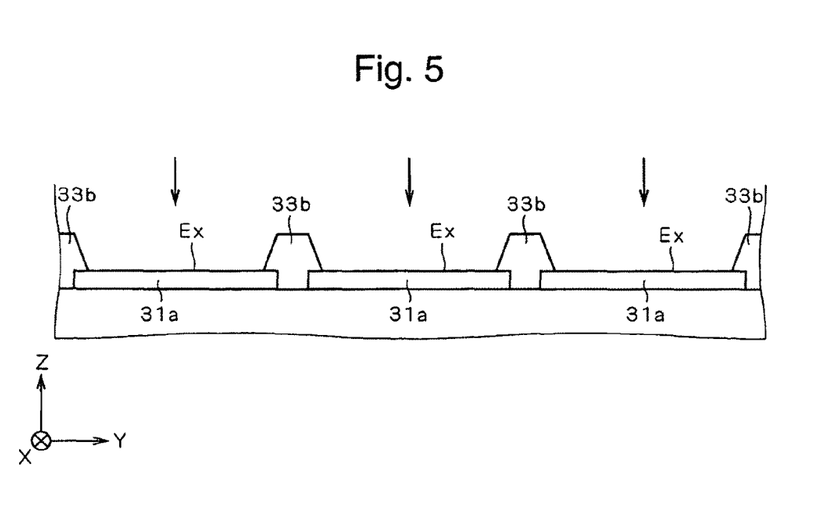
FIG. 5 is a sectional view for explaining the formation of an organic layer.

FIG. 5 is a diagram for explaining the formation of the organic layer 33a. In FIG. 5, the organic layer 33a of FIG. 4 is omitted and thus FIG. 5 shows a state before the organic layer 33a is formed.

As shown in FIG. 5, a predetermined organic matter is deposited on the exposed portion Ex, so that the organic layer 33a of FIG. 4 is formed.

Figure 6:
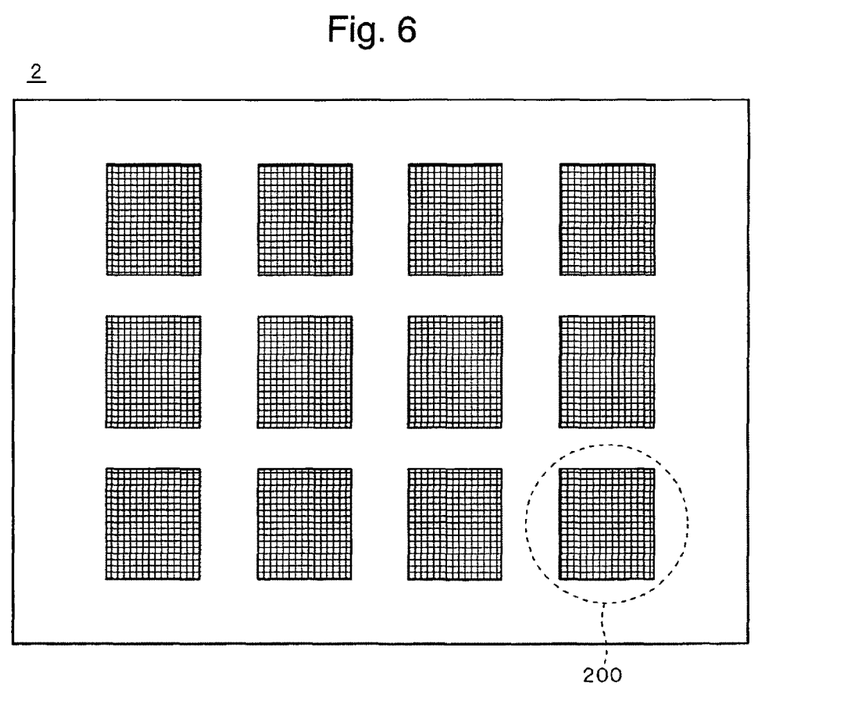
FIG. 6 is a plan view illustrating a metal mask for forming the organic layer.
Figure 7:
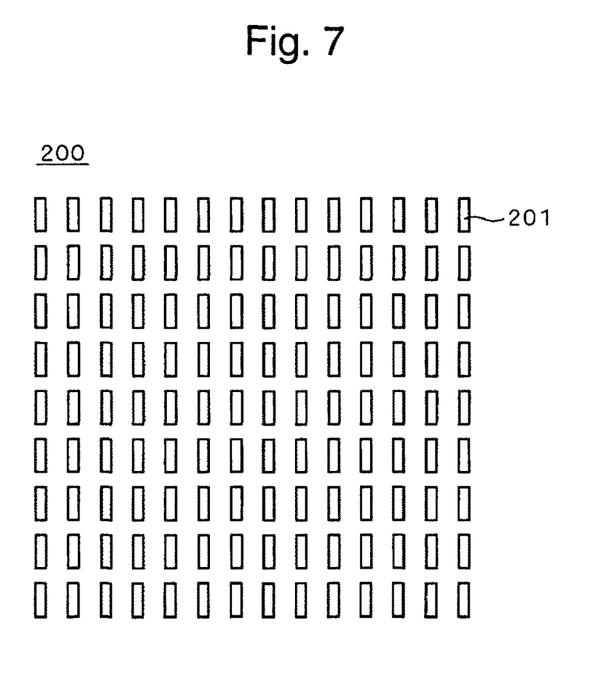
FIG. 7 is a plan view illustrating the metal mask for forming the organic layer.

In this vapor deposition process of the organic matter, a metal mask 2 of FIG. 6 is used. The metal mask 2 has 3×4 cells. As shown in FIG. 7, each of the cells 200 has a number of openings 201 corresponding to the pixels of the organic EL display 21 which is an end product.

Figure 8:
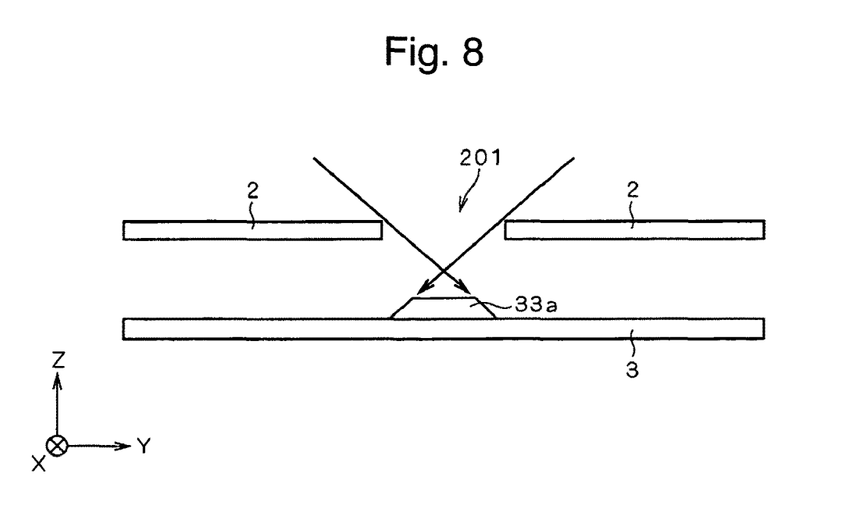
FIG. 8 is a diagram illustrating how the organic layer is formed.

FIG. 8 is a diagram schematically illustrating that the organic layer 33a is formed by vapor deposition using the metal mask 2. In order to avoid complexity, FIG. 8 shows only one organic layer 33a.

As shown in FIG. 8, by depositing the organic matter from the top surface (Z direction) in a state in which the metal mask 2 is placed at a predetermined distance above a layer 3 (formed of the substrate 23, the first electrode 31, and so on) on which the organic layer 33a should be deposited, so that the organic layer 33a is formed. At this point, when there is a distance between the metal mask 2 and the layer 3, the vicinity of the outer edge of the opening 201 has a smaller amount of vapor deposition of the organic matter as compared with the vicinity of the center of the opening 201. As a result, the organic layer 33a tends to have a smaller thickness toward the outer edge. This tendency becomes apparent particularly when the distance between the metal mask 2 and the layer 3 is 3 μm or more.

Figure 9A:
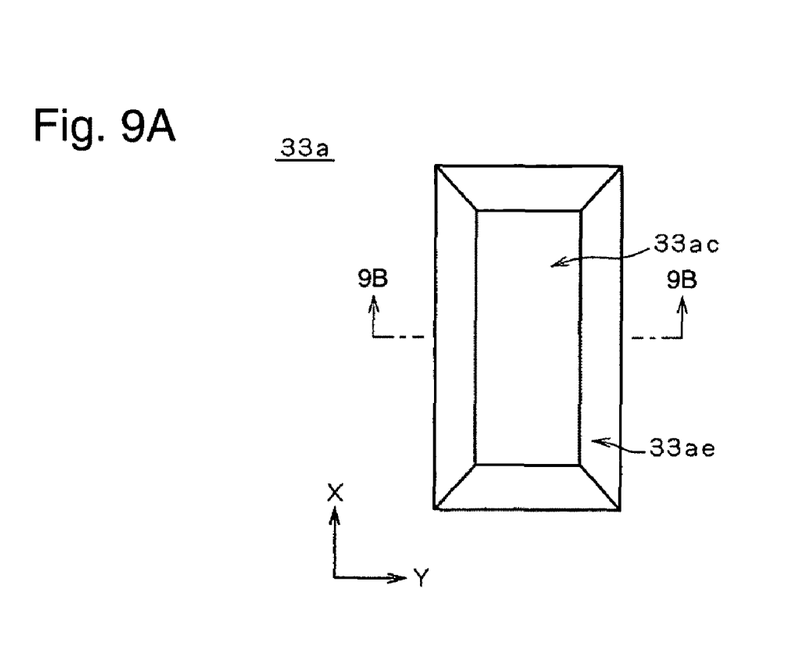
FIG. 9A is a schematic plan view and FIG. 9B is a schematic sectional view illustrating the shape of the organic layer.
Figure 9B:
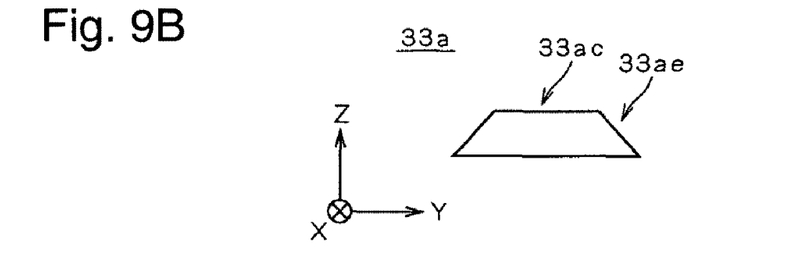

FIGS. 9A and 9B schematically show the enhanced shape of the organic layer 33a. FIG. 9A is a plan view of the Z direction. FIG. 9B is a sectional view taken along line 9B-9B of FIG. 9A.

As shown in FIGS. 9A and 9B, the organic layer 33a is flat at the center of the top surface (surface facing in the Z direction) and has a smaller thickness toward the outer edge. In other words, the organic layer 33a has the thick film portion 33ac which has an almost even thickness and has a flat top surface, and the thin film portion 33ae which has a smaller thickness toward the outer edge and has a tilted top surface.

<The Occurrence of Unevenness on the Screen>

Figure 10:
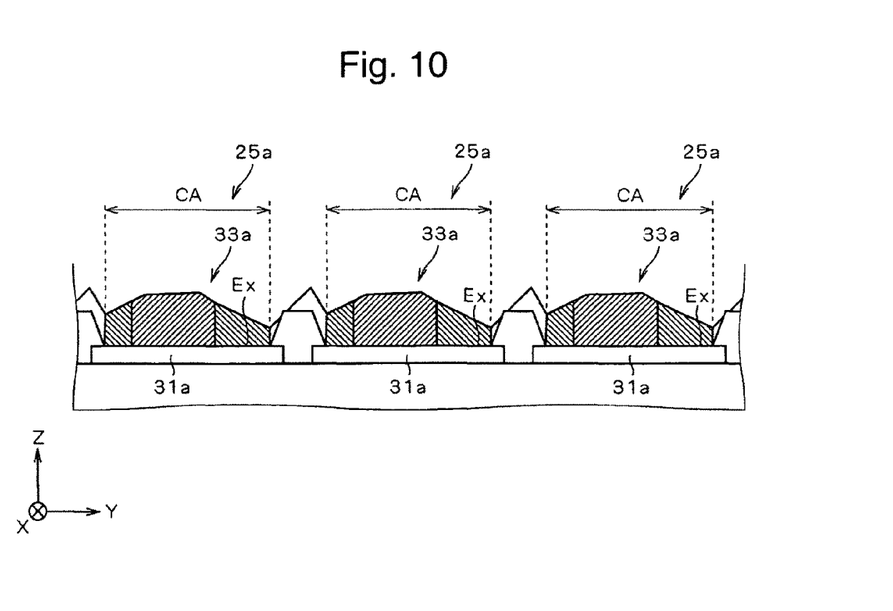
FIG. 10 is a sectional view focusing on the organic EL devices.
Figure 11:
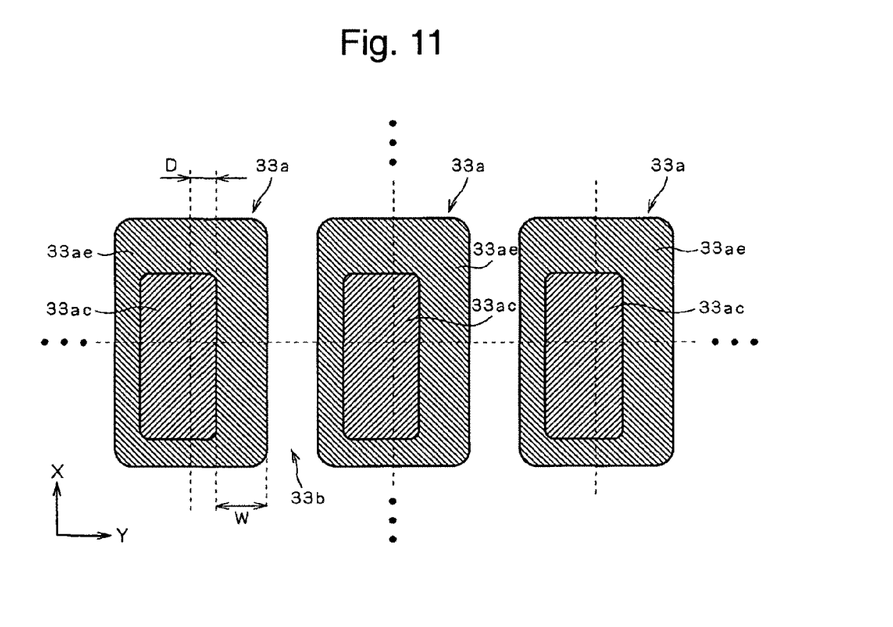
FIG. 11 is a plan view illustrating the layout of the organic layer in the organic EL display.

FIG. 10 focuses on the organic EL devices 25a as in FIG. 4. FIG. 11 shows the layout of the organic layer 33a of FIG. 10 and the layout of the thick film portions 33ac and the thin film portions 33ae as viewed from the top.

As shown in FIG. 10, when viewing the organic EL display 21 from the front (Z direction), in the organic EL device 25a, an area to which the exposed portion Ex is projected in the Z direction in the organic layer 33a corresponds to a portion (pixel opening) CA which looks bright as the organic layer 33a emits light. As shown in FIGS. 10 and 11, each pixel opening CA includes the thick film portion 33ac and the thin film portion 33ae.

In this case, the shortest distance from the thick film portion 33ac to the intermediate insulating film 33b in the Y direction is referred to as a width W of the thin film portion 33ae, and a distance D from the center of the pixel opening CA to the boundary between the thick film portion 33ac and the thin film portion 33ae in the Y direction is used as a parameter indicating a displacement of the thick film portion 33ac from the pixel opening CA.

In the organic EL display 21, it is preferable to evenly form the organic EL devices 25a so as not to cause uneven brightness on the display screen.

However, when the layout and alignment of the openings 201 of the metal mask 2 are displaced from the design of the layout of the exposed portions Ex, the width W of the thin film portion 33ae and the distance D vary among the organic EL devices 25a.

In this respect, the present inventors found that striped unevenness recognizable by a person clearly appears on the display screen of the organic EL display 21 when the width W of the thin film portion 33ae and the distance D greatly vary among the organic EL devices 25a. Further, the inventors found that, in the organic EL display 21, variations in the width W along the short intervals of the pixel layout (Y direction) affect the occurrence of striped unevenness more than variations in the width of the thin film portion 33ae along the long intervals of the pixel layout (X direction).

To be specific, when a variation (difference) $\Delta W$ in the width W between the adjacent organic EL devices 25a is larger than 5% of the average width $W_A$ of the exposed portions corresponding to the adjacent organic EL devices 25a, that is, when $\Delta W/W_A 100>5$ is established, striped unevenness appears. When the variation (difference) $\Delta W$ is 5% or less, the striped unevenness becomes invisible. The width of the exposed portion and the width of the thin film portion are defined in the same direction. When the widths W of the thin film portions are compared between the adjacent organic EL devices 25a to calculate ΔW, the widths W of the thin film portions on the same side are used (in FIG. 11, the thin film portions on the right sides).

The following will show a specific example of the relationship between variations in the width W and the occurrence of striped unevenness.

Specific Example

Figure 12:
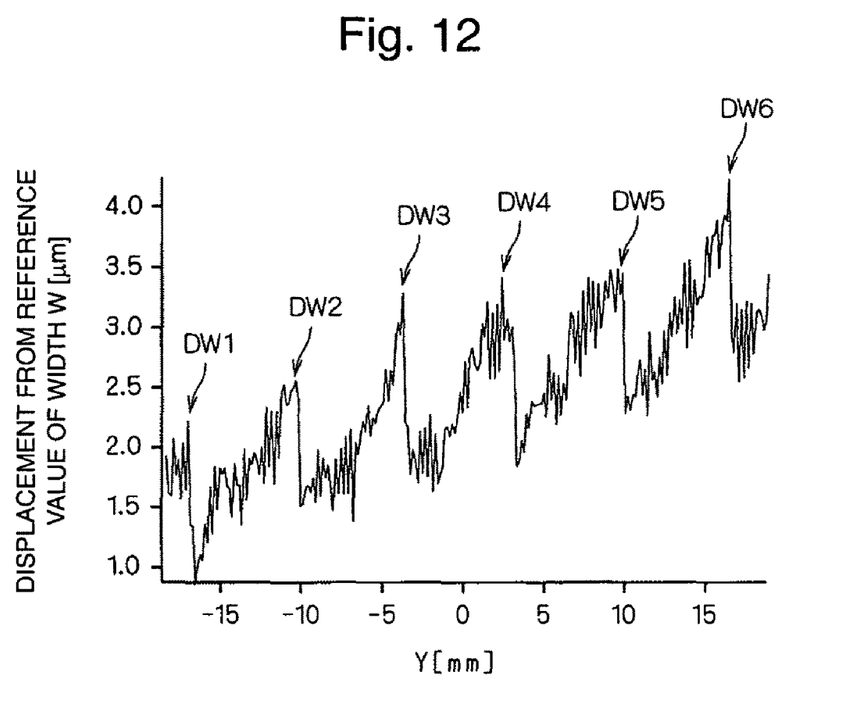
FIG. 12 is a chart illustrating variations in the width of a thin film portion.
Figure 14:
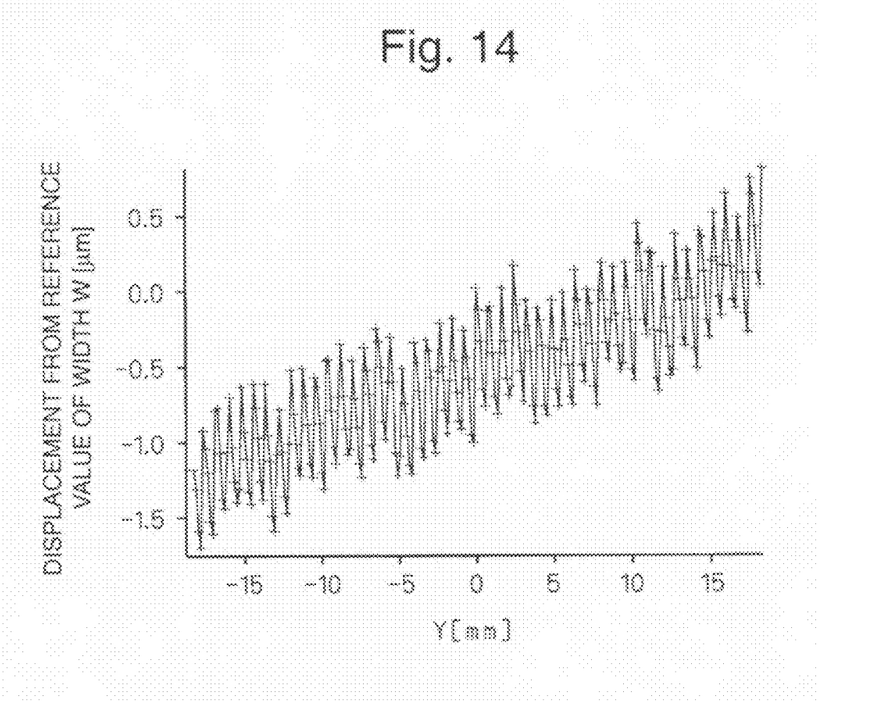
FIG. 14 is a chart illustrating variations in the width of the thin film portion.
Figure 16:
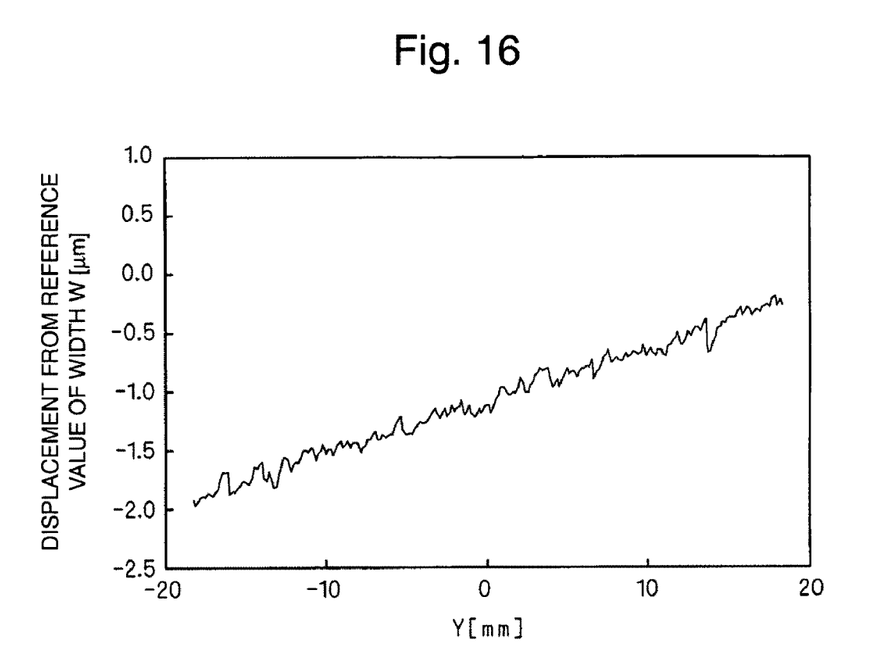
FIG. 16 is a chart illustrating variations in the width of the thin film portion.

FIGS. 12, 14 and 16 show variations in the width W of the thin film portion 33ae. The horizontal axis represents a position in a direction along which the organic EL devices 25a are placed at short intervals (for example, the Y direction in FIG. 11) and the vertical axis represents a displacement from a reference value (a predetermined design value). The interval between the organic EL devices is represented as a distance between the centers of the adjacent organic EL devices.

Figure 13A:
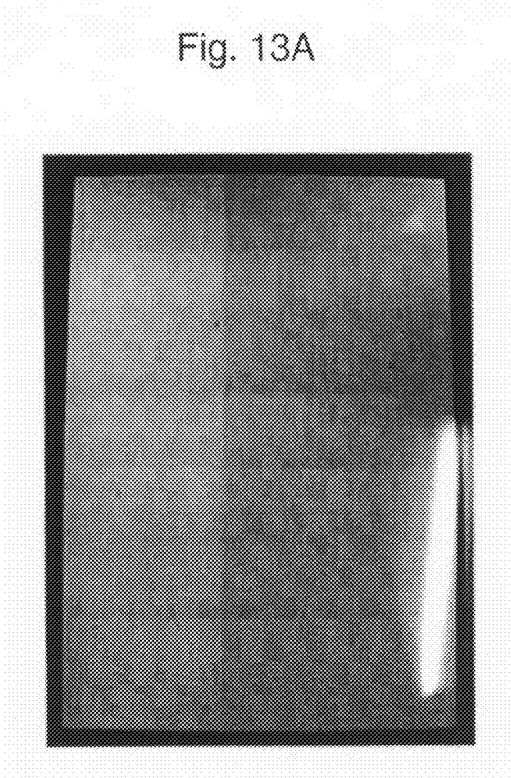
FIG. 13A is a photograph showing an appearance of a display screen.
Figure 13B:
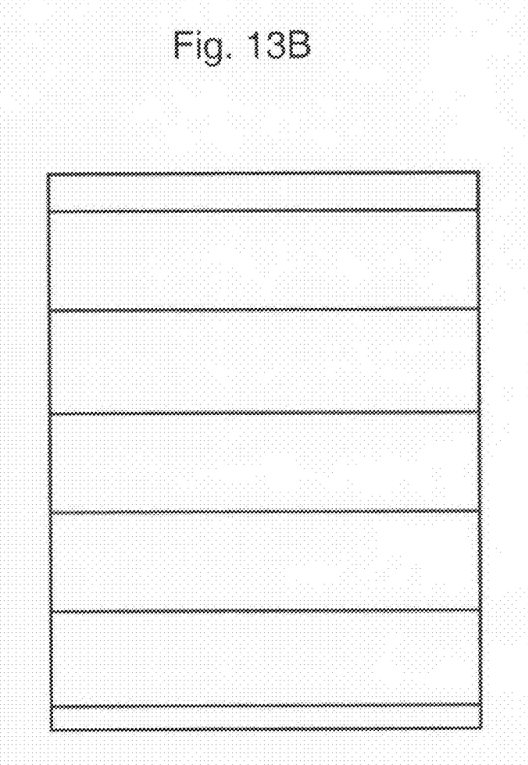
FIG. 13B is a diagram illustrating a state of the display screen.
Figure 15:
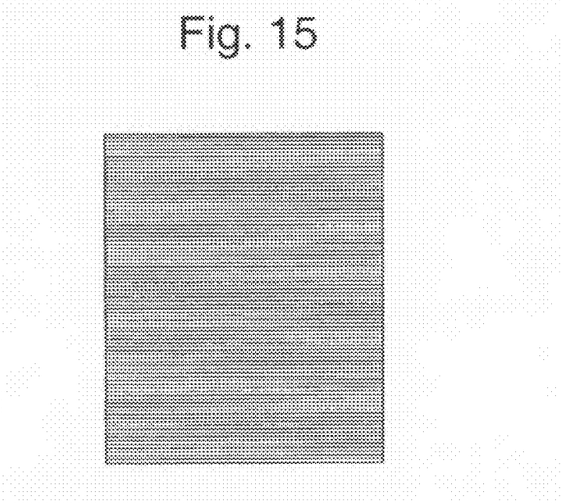
FIG. 15 is a diagram illustrating a state of the display screen.
Figure 17:
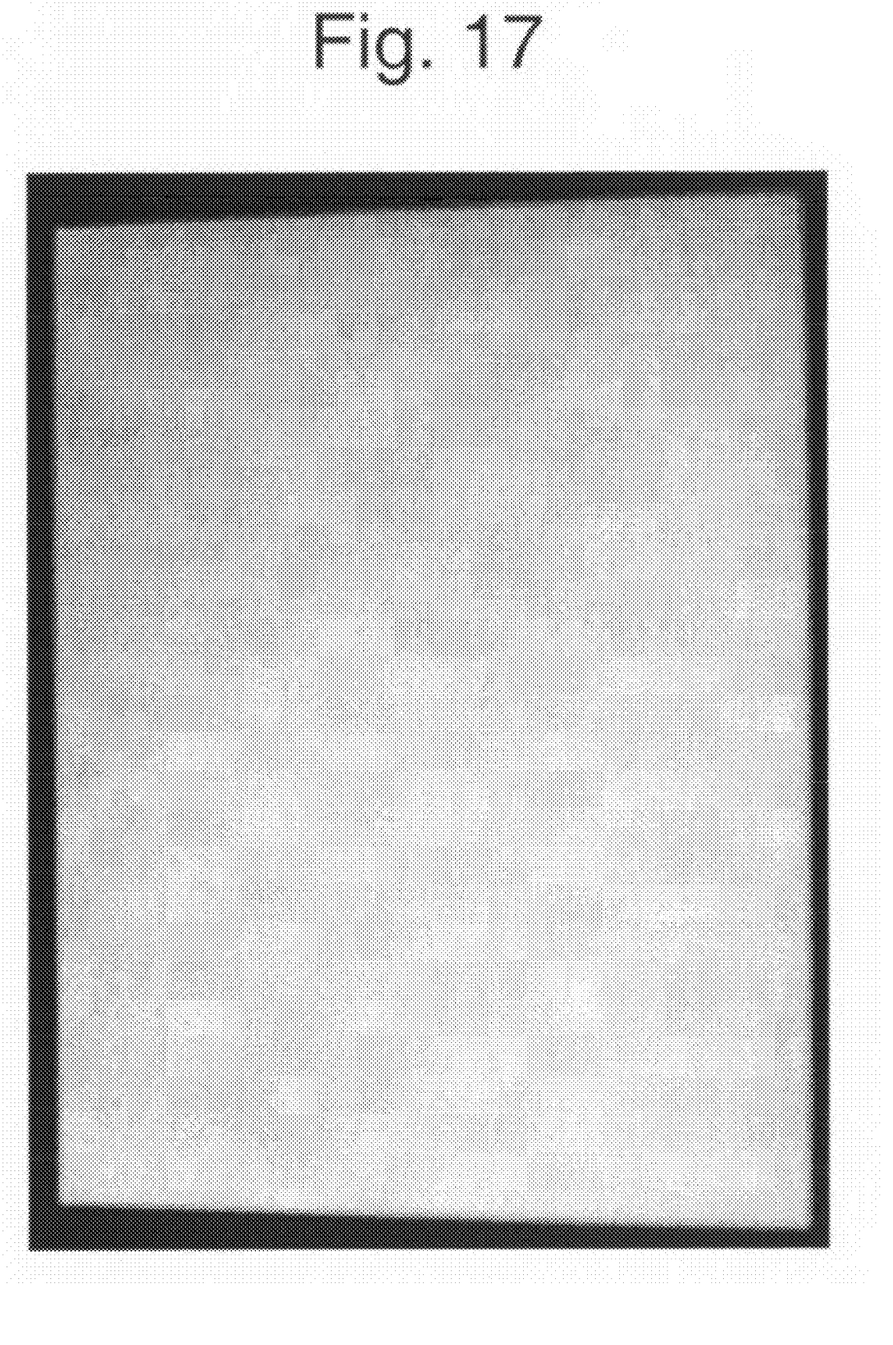
FIG. 17 is a photograph showing an appearance of the display screen.

FIGS. 13, 15 and 17 show the states of the display screen when the width W varies as shown in FIGS. 12, 14 and 16. FIG. 13A shows an image obtained by directly photographing the display screen. FIG. 13B is a conceptual rendering of the display screen which clearly shows the areas of striped unevenness in FIG. 13A with lines. FIG. 15 is a schematic drawing illustrating the areas of striped unevenness appearing on the display screen. FIG. 17 shows an image obtained by directly photographing the display screen.

As shown in FIG. 12, the presence of portions DW1 to DW6 (six in total) where $\Delta W/W_A$ is larger than 0.05 between adjacent organic EL devices 25a causes, as shown in FIG. 13, striped unevenness on the display screen according to variations in the width W.

As shown in FIG. 14, when the number of portions where $\Delta W/W_A$ is larger than 0.05 between adjacent organic EL devices 25a is larger than that of FIG. 12, a number of uneven stripes appear as shown in FIG. 15 on the display screen so as to correspond to the number of portions where the width W greatly varies.

As shown in FIG. 16, when $\Delta W/W_A$ is 0.05 or less, and particularly when the maximum value is not more than 0.02 between adjacent organic EL devices 25a, no striped unevenness appears on the display screen as shown in FIG. 17.

<The Reduction of Unevenness on the Screen>

As described in the specific example above, in the presence of portions where $\Delta W/W_A$ is larger than 0.05 between adjacent organic EL devices 25a, striped unevenness corresponding to the portions appears on the display screen. Thus, the occurrence of striped unevenness on the display screen can be reduced by adjusting $\Delta W/W_A$ to 0.05 or less between adjacent organic EL devices 25a.

Further, it is possible to adjust $\Delta W/W_A$ between adjacent organic EL devices 25a to about 0.05 or less by adjusting the widths W of the organic EL devices 25a to be substantially equal.

As above, reduction of variations in the widths W between the organic EL devices 25a is attainable by elaborating so as to improve various accuracies in the manufacturing process, for example, in the steps of preparing metal mask 2 and vapor deposition of the organic layer 33.

The following will describe ingenuity in the manufacturing of the metal mask 2 and the vapor deposition of the organic layer 33.

<The Method of Manufacturing the Mask>

The metal mask 2 is fabricated by the steps of (1) fabricating a master photomask, (2) forming a resist pattern, (3) forming a metal mask on a base material, (4) fixing the metal mask on a frame, and (5) removing the base material.

The steps (1) to (5) will be specifically described below.

A metal (Cr) having been deposited over a glass substrate is coated with a photoresist, and the photoresist is exposed by laser lithography. And then, a portion having been radiated in the photoresist with a laser is removed by development. After that, the exposed Cr is dissolved by dipping the glass substrate into a predetermined etching solution, and then the remaining photoresist is removed, so that the master photomask, in which radiated light passes through the portion having been removed by dissolving Cr, is completed.

In laser lithography used for fabricating the master photomask, adjustments such as the presence or absence of radiated light can be more accurately realized in the scanning direction. Thus in this case, laser lithography was performed by scanning in a direction along which pixels are arranged at relatively short intervals. This is because variations in accuracy of position affect the occurrence of striped unevenness more greatly in a direction along which pixels are arranged at relatively short intervals (Y direction) than in a direction along which pixels are arranged at relatively long intervals (X direction) in the organic EL display 21.

And then, a photoresist film is applied on a base material such as stainless steel and development is performed thereon after light exposure using the master photomask, so that the resist pattern is formed as a base of the metal mask. After that, a nickel alloy or the like is electroformed on the base material where the resist pattern has been formed, so that a metal mask is formed on the base material. And then, the mask frame is fixed on the metal mask and the base material is removed, so that the metal mask 2 can be fabricated.

As described above, the metal mask 2 formed on the base material is fixed on the metal frame without being exfoliated from the base material, and then the base material is removed. This method can improve the accuracy of position of the openings 201 on the metal mask 2.

In this method, main tension applied to the fabricated metal mask 2 is limited to membrane stress which is applied when the metal mask 2 is fabricated on the base material. Thus unlike a conventional method in which a metal mask is exfoliated from a base material and then is bonded and fixed to a metal frame while the ends of the metal mask are pulled to apply tension to the metal mask, the positions of the openings 201 can be evenly controlled with high accuracy.

<Mask Alignment>

Although the accuracy of position can be improved as above for the opening 201 of the metal mask 2, when the organic film is deposited, it is necessary to accurately align the position of the metal mask 2 relative to the substrate in order to improve the accuracy of vapor deposition of the organic film.

As shown in FIG. 2, a number of pixels are two-dimensionally arranged in two directions (X direction and Y direction) substantially perpendicular to each other in the organic EL display 21. Focusing on this point, when aligning the position of the metal mask 2 relative to the substrate, the accuracy of positioning is increased in a direction (Y direction) along which pixels are arranged at relatively short intervals as compared with a direction (X direction) along which pixels are arranged at relatively long intervals (that is, displacement from the design position is reduced), so that the position of the metal mask 2 can be accurately aligned relative to the substrate.

The following will discuss a reason why such alignment is performed.

When it is assumed that the position of the metal mask 2 is aligned with high accuracy in all the directions including not only the Y direction but also the X direction, a long time and a number of positioning operations are necessary to adjust the positional relationship between the metal mask 2 and the substrate within a set range of accuracy. As a result, there is an increased risk that retention in the manufacturing process may deteriorate the manufacturing tact and the metal mask 2 brought into contact with the substrate in a number of positioning operations may scratch the substrate.

Therefore, in consideration of the balance among the display quality of the screen, the yield, the productivity, and the like, it is preferable in the alignment of the metal mask 2 relative to the substrate to increase the accuracy of alignment in a direction (Y direction) along which pixels are arranged at relatively short intervals as compared with a direction (X direction) along which pixels are arranged at relatively long intervals.

Further, the widths W of the thin film portions 33ae are adjusted so as to be substantially equal between the organic EL devices 25a. The width W is a distance from the thick film portion 33ae to the intermediate insulating film 33b along a predetermined direction (Y direction in the above description) in the organic EL device 25a. As a result, it is possible to prevent striped unevenness from appearing on the display.

<Modification>

The above explanation described the embodiment of the present invention. The present invention, however, is not limited to the above description.

For example, as described above, by keeping $\Delta W/W_A$ at 0.05 or less between adjacent organic EL devices 25a, it is possible to reduce the occurrence of striped unevenness on the display screen, whereas as shown in FIGS. 16 and 17, by keeping $\Delta W/W_A$ at 0.02 or less between adjacent organic EL devices 25a, it is possible to more positively reduce the occurrence of striped unevenness on the display screen.

In the present embodiment, for all the organic EL devices 25a included in the organic EL display 21, that is, for an area including all the organic EL devices 25a (display area), variations in the width W were adjusted between adjacent organic EL devices 25a. The present invention is not limited to such an adjustment. For example, in order to prevent the occurrence of striped unevenness in a partial area (for example, a square area of 0.2 mm×0.2 mm) of a predetermined size included in the display screen of the organic EL display 21, variations in $\Delta W/W_A$ may be adjusted between adjacent organic EL devices 25a in the partial area.

In the present embodiment, the width W is adjusted in view of variations in the width W of the thin film portion. The distance D from the center of the pixel opening CA to the boundary between the thick film portion 33ac and the thin film portion 33ae in a predetermined direction (for example, Y direction) may be adjusted. To be specific, the distances D may be evenly set between the organic EL devices in a predetermine direction, or $\Delta D/W_A$ obtained by dividing a variation $\Delta D$ of the distance D by the average width $W_A$ of the exposed portions may be set at 0.05 or less between adjacent organic EL devices.

What is claimed is:

1. An organic EL display comprising:
   a plurality of organic EL devices, each including:
   a first electrode having an exposed portion thereof,
   a second electrode, and
   an organic portion between the first and the second electrodes, the organic portion is formed on at least the exposed portion of the first electrode,
   wherein the organic portion has a thick portion and a thin portion around the thick portion, and
   wherein $\Delta W$ represents a variation in a width of the thin portion between adjacent organic EL devices that are located in an area, and $W_A$ represents an average width of the exposed portions of the first electrodes in the adjacent organic EL devices in the area, and
   wherein $\Delta W/W_A$ is 0.05 or less.

2. The organic EL display according to claim 1, wherein a thickness of the thin portion is 95% or less of a thickness of the thick portion.

3. The organic EL display according to claim 1, wherein the area is a square area of 0.2 mm×0.2 mm.

4. The organic EL display according to claim 1, wherein the area is a display area including all the organic EL devices.

5. The organic EL display according to claim 2, wherein the plurality of organic EL devices are arranged at a first interval along a first direction and arranged at a second interval along a second direction, the second interval being shorter than the first interval, and wherein the width of the thin portion and the average width of the exposed portions is along the second direction.

6. The organic EL display according to claim 2, wherein the organic EL device has a rectangular shape having long sides and short sides in plan view and disposed so that a direction along the long sides is substantially parallel with a first direction and a direction along the short sides is substantially parallel with a second direction.

* * * * *